United States Patent [19]

Gates

[11] 4,180,827

[45] Dec. 25, 1979

[54] NPN/PNP FABRICATION PROCESS WITH IMPROVED ALIGNMENT

[75] Inventor: Harlan R. Gates, Reston, Va.

[73] Assignee: International Business Machines Corporation, Armonk, N.Y.

[21] Appl. No.: 830,222

[22] Filed: Aug. 31, 1977

[51] Int. Cl.$^2$ .............................................. H01L 27/02
[52] U.S. Cl. ......................................... 357/44; 357/35; 357/48; 357/92
[58] Field of Search ..................... 357/44, 92, 35, 48

[56] References Cited

U.S. PATENT DOCUMENTS

| 4,054,900 | 10/1977 | Tokumaru et al. | 357/44 |
| 4,058,419 | 11/1977 | Tokumaru et al. | 357/44 |

Primary Examiner—Edward J. Wojciechowicz
Attorney, Agent, or Firm—John E. Hoel

[57] ABSTRACT

A double diffused, lateral PNP structure is disclosed which may be formed simultaneously with a vertical NPN structure. The novel feature of the structure is believed to be the vertical projection of the N-type base region for the PNP, down through the surrounding diffused P-type collector and into an N-type epitaxial layer between the collector diffusion and a buried sub-base, an N-type sub-base to electrically contact the base. The N-type epitaxial layer serves as the extrinsic base region permitting contact with the surface. The double diffused base and emitter structure permits a precise intrinsic base width to be formed for the lateral PNP. Thus, a high performance PNP can be constructed with compatible high performance NPNs on the same substrate.

2 Claims, 9 Drawing Figures

NPN/PNP FABRICATION PROCESS WITH IMPROVED ALIGNMENT

FIELD OF THE INVENTION

The invention generally relates to semiconductor device structures and more particularly relates to improved bipolar transistors.

BACKGROUND OF THE INVENTION

Y. Tokumaru, et al., "I²L with Self-Aligned Double Diffused Injector", 1976, IEEE Solid State Conference, pp. 100-101, shows in FIG. 5 a lateral PNP transistor and vertical NPN transistor formed in a P-type epitaxial layer, the base of the NPN transistor is the epitaxial layer itself. This is a typical low cost, low performance structure for complementary bipolar devices which suffers from the relatively wide tolerances in the thickness of the epitaxial layer and consequent wide variations in the performance of the NPN device. The subject disclosure improves upon this prior art structure by forming the base of the vertical NPN and the collector on the lateral PNP as a diffused or ion-implanted region in an N-type epitaxial layer, during the same step. The base thickness of the NPN device is therefore no longer dependent upon the thickness of the epitaxial layer and the simultaneous formation of the PNP and the NPN attributes to an economic, efficient process. The base-collector capacitance of the lateral PNP device in the subject disclosure is reduced with respect to the prior art structure, since the concentration of the N-type epitaxial region surrounding the collector and which serves as the extrinsic base is relatively low.

U.S. Pat. No. 3,977,920 suffers from the same deficiencies as does the Tokumara publication.

OBJECTS OF THE INVENTION

It is an object of the invention to form a double diffused PNP whose base is compatible with the reachthrough of the NPN device, and whose collector is compatible with the base of the NPN, and whose emitter can be compatible with the base contact of the NPN.

SUMMARY OF THE INVENTION

These and other objects are accomplished by the structure disclosed herein.

A double diffused, lateral PNP structure is disclosed which may be formed simultaneously with a vertical NPN structure. The novel feature of the structure is believed to be the vertical projection of the N-type base region for the PNP, down through the surrounding diffused P-type collector and into an N-type epitaxial layer between the collector diffusion and a buried sub-base, an N-type sub-base to electrically contact the base. The N-type epitaxial layer serves as the extrinsic base region permitting contact with the surface. The double diffused base and emitter structure permits a precise intrinsic base width to be formed for the lateral PNP. Thus, a high performance PNP can be constructed with compatible high performance NPNs on the same substrate.

DESCRIPTION OF THE FIGURES

These and other objects will be more fully understood with reference to the accompanying drawings.

In the embodiment of FIGS. 1a-1i, it is preferred to overlap the PNP base region with the PNP collector to eliminate unwanted injection into the N-epi.

DISCUSSION OF THE PREFERRED EMBODIMENT

Figure 1A:
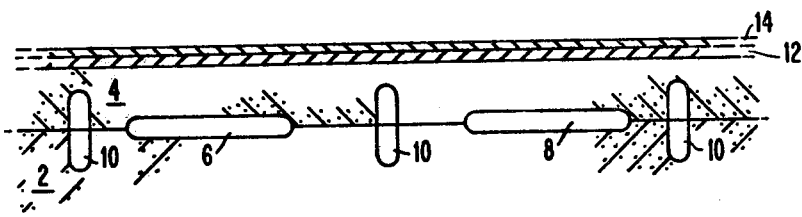
FIGS. 1a-1i show the formation of NPN and PNP devices where the N reachthrough is formed only in the contact window thereby it is not used as a guard ring.
Figure 1B:
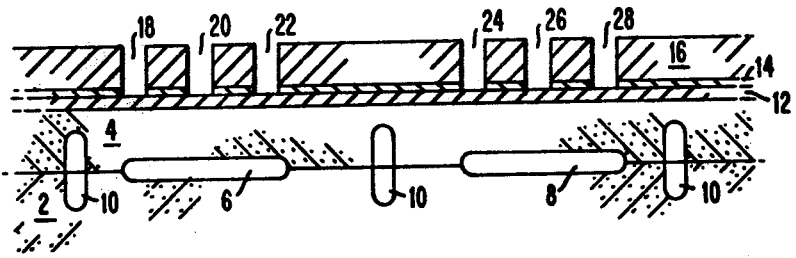
Figure 1C:
Figure 1D:
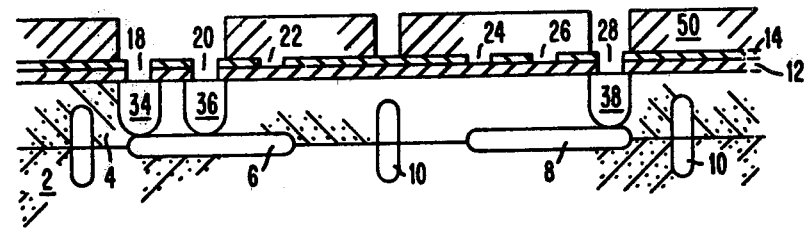
Figure 1E:
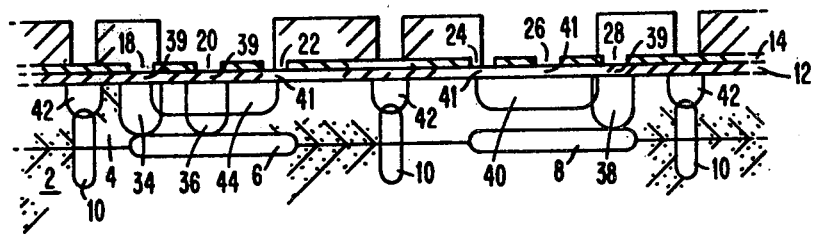
Figure 1F:
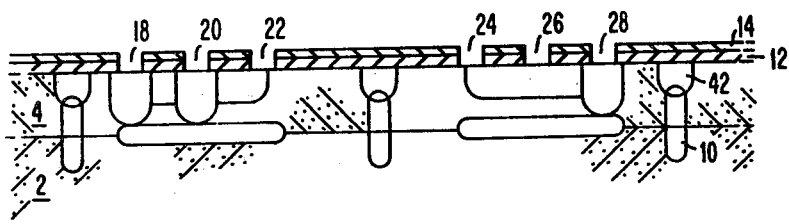
Figure 1G:
Figure 1H:
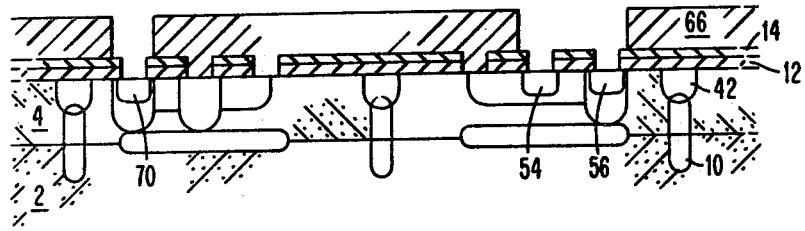
Figure 1I:
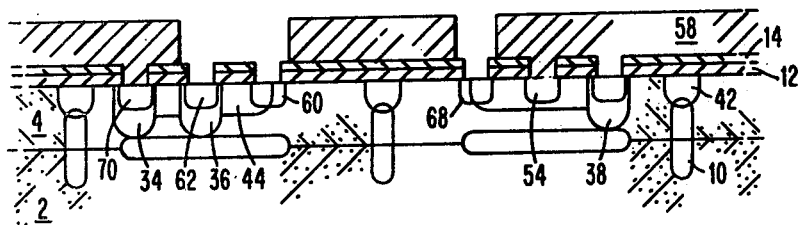

A double diffused, lateral PNP structure is disclosed which may be formed simultaneously with the vertical NPN structure on the right side of FIG. 1i in the disclosure. The novel feature of the structure is believed to be the vertical projection of the N-type base region for the PNP, down through the surrounding diffused P-type collector and into an N-type epitaxial layer between the collector diffusion and a buried N-type sub-base to electrically contact the base. The N-type epitaxial layer serves as the extrinsic base region permitting contact with the surface. The double diffused base and emitter structure permits a precise intrinsic base width to be formed for the lateral PNP. Thus, a high performance PNP can be constructed with compatible high performance NPNs on the same substrate.

FIGS. 1a-1i show a process sequence for the formation of NPN and PNP devices.

In FIG. 1a, the process follows conventional masking and doping (diffusion or ion implant) and deposition techniques to form the N+ 6, 8 and P+ 10 buried regions, N-epitaxial layer 4, on substrate 2, epi reoxidation 12, and Si3N4 layer 14.

In FIG. 1b, all contact holes 18, 20, 22, 24, 26, 28 are etched (RIE preferred) through Si3N4 14 using photoresist mask 16. The top view of this mask is shown in FIG. 1c.

In FIG. 1d, the next mask defines a PR blockout mask 50 for the oxide etch and N phosphorous implant which serves as reachthrough contacts 34, 38 to the N+ buried layers 6, 8, respectively, and as PNP base region 36, and to form low value N resistors (75 ohms/sq). The implant is done at low energy such that the oxide/nitride windows 18, 20, 28 define the doped regions. A subsequent reoxidation 39 shown in FIG. 1e is done which grows slightly less than the original epi reoxidation cycle 12 and diffuses the N regions 34, 36, 38 to contact the up-diffused buried N+ regions 6 and 8. During this oxidation step, the oxide 41 in the contact regions 22, 24, 26 will grow a lesser amount to give ion deceleration approximately equivalent to the oxide 12 plus nitride 14 layers.

In FIG. 1e, the NPN base 40, PNP collector 44, and top isolation regions 42 are then formed by a PR masked double energy boron ion implant. The boron is implanted through the oxide 39, 41 and oxide 12 nitride 14 layers. Note that the regions 40, 44 need not overlap their respective contact windows 24, 22 and that their intersection with the N regions 38, 34, respectively, is not critical since the P regions 40, 44 are compensated by the N regions 38, 34. For decreased capacitance between these P and N regions 40 and 38, 44 and 34, they may be spaced apart with a slight increase in device size. The P region 40 has a high sheet resistance (1000 ohms/sq) for low NPN emitter-base capacitance, high PNP collector-base breakdown and may be used to form resistors.

In FIG. 1f, all contact holes 18, 20, 22, 24, 26, 28 are etched through the SiO2 39, 41, with the Si3N4 layer 14 serving to mask the etch. No photo mask layer is needed for this etch.

FIG. 1g shows the top view of the Si$_3$N$_4$ defined SiO$_2$ windows 18, 20, 22, 24, 26, 28.

The next two steps use a blocking photoresist to mask ion implants. The order of the steps may be interchanged.

1. FIG. 1h shows use of a PR mask 66 to form N+ (arsenic) NPN emitter 54, collector-reach through contact 56, and PNP base-reach through contact 70. Mask 66 is a blockout mask. The implant is defined by the Si$_3$N$_4$ layer 14/SiO$_2$ layer 12 openings.

2. FIG. 1i shows use of a PR mask 58 to form P+ (boron) PNP emitter 62, collector contact 60, and NPN base contact 68. Mask 58 is a blockout mask. The implant is defined by the Si$_3$N$_4$ layer 14/SiO$_2$ layer 12 openings.

Following these implant steps, an anneal/drive is used to activate the implanted species and diffuse the N+ and P+ regions to the final junction depths.

While the invention has been particularly shown and described with reference to the preferred embodiments thereof, it will be understood by those skilled in the art that the foregoing and other changes in form and details may be made therein without departing from the spirit and scope of the invention.

I claim:

1. A lateral PNP bipolar transistor structure, comprising:
    an epitaxial layer of a first conductivity type over a buried sub-base region of said first conductivity type;
    a collector region of a second conductivity type formed in the surface of said epitaxial layer over said buried sub-base region;
    a base region of said first conductivity type formed over said collector region through a mask window and projecting through said collector region into said epitaxial layer and electrically contacting said sub-base region;
    an emitter region of said second conductivity type formed within said base region through said mask window, defining an intrinsic lateral base region between the lateral sides of the emitter region and the base region;
    a base contact on the surface of said epitaxial layer for making electrical contact with said base region;
    whereby a lateral PNP is formed with a reduced collector to base capacitance.

2. A lateral PNP transistor formed in an integrated circuit including vertical NPN transistors, comprising:
    an epitaxial layer of a first (N) conductivity type, having a plurality of buried high conductivity regions of said first conductivity type therein, divided into a first plurality of isolated regions containing PNP transistors and a second plurality of isolated regions containing NPN transistors;
    a plurality of regions of a second conductivity type (P) in the surface of said substrate, with a first one in one of said first plurality isolated regions serving as the collector region for said lateral PNP and a second one in one of said second plurality of isolated regions serving as the base region for said vertical NPN transistor, with each one of said plurality of regions of said second conductivity type lying over a corresponding one of said buried, high conductivity regions;
    a region of said first conductivity type (N) formed through a window over said collector of said lateral PNP and projecting through said collector into said epitaxial layer and electrically contacting said buried high conductivity region as the base of said lateral PNP;
    a region of said second conductivity (P) type formed in said substrate through said window over said collector of said lateral PNP and contained within said base region for said lateral PNP, as the emitter of said lateral PNP;
    a plurality of regions of said first conductivity type, a first one of which is formed in said epitaxial layer in said one of said first plurality of isolated regions, serving as the base contact for said PNP transistor, a second one of which is formed in said epitaxial layer in said one of said second plurality of isolated regions as the collector contact for said NPN transistor and a third one of which is formed in said base region of said NPN transistor as the emitter thereof;
    whereby compatible, high performance PNP and NPN transistors can be formed in an integrated circuit.

* * * * *